(12) United States Patent
Mateosky et al.

(10) Patent No.: US 7,733,999 B2
(45) Date of Patent: Jun. 8, 2010

(54) SYSTEM AND METHOD FOR AN ADAPTABLE TIMING RECOVERY ARCHITECTURE FOR CRITICALLY-TIMED TRANSPORT APPLICATIONS

(75) Inventors: John P. Mateosky, West River, MD (US); John H. Brownlee, Tucker, GA (US); Matthew W. Connolly, Canton, GA (US)

(73) Assignee: Ciena Corporation, Linthicum, MD (US)

( * ) Notice: Subject to any disclaimer, the term of this patent is extended or adjusted under 35 U.S.C. 154(b) by 855 days.

(21) Appl. No.: 11/471,010

(22) Filed: Jun. 20, 2006

(65) Prior Publication Data

US 2007/0291888 A1  Dec. 20, 2007

(51) Int. Cl.
*H03D 3/24* (2006.01)

(52) U.S. Cl. .......................... 375/373; 375/354; 327/2

(58) Field of Classification Search .................. 375/353, 375/354, 215, 373, 376, 229–236, 240.28, 375/240.29, 371; 327/2, 311, 555, 552, 551
See application file for complete search history.

(56) References Cited

U.S. PATENT DOCUMENTS

| | | | | |
|---|---|---|---|---|
| 4,635,277 A * | 1/1987 | Blake et al. | ................. | 375/293 |
| 4,815,106 A * | 3/1989 | Propp et al. | ................. | 375/257 |
| 5,661,762 A * | 8/1997 | Petranovich et al. | ......... | 375/347 |
| 5,834,980 A * | 11/1998 | Pitio et al. | ....................... | 331/2 |
| 5,987,085 A * | 11/1999 | Anderson | .................... | 375/374 |
| 6,101,158 A * | 8/2000 | Hogan | ......................... | 369/47.3 |
| 6,313,708 B1 * | 11/2001 | Beaulieu | ...................... | 331/17 |
| 6,501,809 B1 * | 12/2002 | Monk et al. | .................. | 375/363 |
| 6,658,074 B1 * | 12/2003 | Murakami | ................... | 375/372 |
| 6,747,996 B2 * | 6/2004 | Holloway et al. | ............ | 370/503 |
| 6,888,806 B1 * | 5/2005 | Miller et al. | ................. | 370/316 |
| 6,909,512 B1 * | 6/2005 | Vasudevan et al. | ........... | 356/521 |
| 6,956,873 B2 * | 10/2005 | Lazarus et al. | ............... | 370/518 |
| 6,975,655 B2 * | 12/2005 | Fischer et al. | ................ | 370/516 |
| 7,359,406 B2 * | 4/2008 | Holloway et al. | ............ | 370/503 |
| 7,375,591 B2 * | 5/2008 | Fu et al. | ...................... | 331/1 A |
| 7,613,211 B1 * | 11/2009 | Fagerlund et al. | ............ | 370/504 |
| 2003/0043950 A1 * | 3/2003 | Hansen et al. | ............... | 375/376 |
| 2003/0215043 A1 * | 11/2003 | Ibukuro et al. | ............... | 375/376 |
| 2004/0008066 A1 * | 1/2004 | Sasaki et al. | ................. | 327/165 |
| 2004/0252802 A1 * | 12/2004 | Yamaguchi | .................. | 375/371 |
| 2005/0017847 A1 * | 1/2005 | Bonicatto et al. | ....... | 340/310.01 |
| 2005/0069070 A1 * | 3/2005 | Paillet et al. | ................. | 375/355 |
| 2005/0135465 A1 * | 6/2005 | Andrus et al. | ................ | 375/220 |
| 2005/0147197 A1 * | 7/2005 | Perrott | ......................... | 375/376 |
| 2005/0185742 A1 * | 8/2005 | Liu | .............................. | 375/348 |

(Continued)

*Primary Examiner*—Chieh M Fan
*Assistant Examiner*—Santiago Garcia
(74) *Attorney, Agent, or Firm*—Clements Bernard PLLC; Christopher L. Bernard; Tyler S. Brown

(57) ABSTRACT

The present invention provides a timing recovery architecture and circuit for recovering the clock timing from a received signal in critically-timed transport applications. The present invention further relates to a timing recovery architecture and circuit for removing network-induced clock jitter and wander that occurs in a transport network during asynchronous mapping techniques, bit and/or byte-stuffing techniques, or traditional pointer adjustment schemes associated with traditional PDH (pleisiosynchronous digital hierarchy), SDH (synchronous digital hierarchy), and packet-based networks. The timing recovery circuit may be implemented in a logic circuit such as programmable, digital FPGA (field programmable gate array) logic, or alternatively in standard cell or gate-array ASIC (application-specific integrated circuit) technology, or like logic circuit design.

15 Claims, 9 Drawing Sheets

U.S. PATENT DOCUMENTS

2006/0034395 A1* 2/2006 Evans et al. ................. 375/326
2006/0050819 A1* 3/2006 Van Houdt et al. .......... 375/354
2006/0119402 A1* 6/2006 Thomsen et al. ............ 327/105
2007/0097781 A1* 5/2007 Li et al. ...................... 365/233
2007/0291888 A1* 12/2007 Mateosky et al. ........... 375/372

* cited by examiner

SYSTEM AND METHOD FOR AN ADAPTABLE TIMING RECOVERY ARCHITECTURE FOR CRITICALLY-TIMED TRANSPORT APPLICATIONS

FIELD OF THE INVENTION

The present invention relates generally to timing synchronization systems in transport communications networks. More specifically, the present invention relates to systems and methods for a timing recovery architecture and circuit for recovering the clock timing from a received signal in critically-timed transport applications. The timing recovery circuit may be implemented in programmable, digital FPGA (field programmable gate array) logic and, alternatively, in standard cell or gate-array ASIC (application-specific integrated circuit) technology. The present invention further relates to a timing recovery architecture and circuit for removing network-induced clock jitter and wander that occurs in a transport communications network during asynchronous mapping techniques, bit and/or byte-stuffing techniques, or pointer adjustment schemes associated with traditional PDH (plesiosynchronous digital hierarchy), SDH (synchronous digital hierarchy), and packet-based networks.

BACKGROUND OF THE INVENTION

In the fields of data communications and telecommunications there often exists the need to recover the timing of a critically-timed transported signal. For example, where signals are mapped or transformed for transmission into frames or packets of a particular protocol by adding overhead and/or fixed stuff information and rate justification by pointer or stuffing information, thereby altering the signal's original timing, to facilitate transport of the signals through various mediums (optical, free space, electrical conduit, etc.), upon reception these signals must then be de-mapped or inverse transformed back into the signal's original format and timing characteristics. Some transport signals have stringent timing characteristics. For example, the transport of studio quality, high definition, or standard definition digital video requires stringent timing characteristics in order to provide high quality video without lossy data compression. The critical timing specifications for video signaling are very stringent due to the nature and format of the video signal (such as the chrominance and luminance representation in component video formats), as well as the display requirements associated with interlaced active field scan and the blanking criteria inherent in video in general.

Current state-of-the-art timing synchronization systems reside in anti-jitter circuits such as the DPLL (digital phase-locked loop) architectures, which are typically FIR (finite impulse response) and IIR (infinite impulse response) filter designs. These filter designs can employ multi-rate and adaptive techniques. Various companies have designed such DPLL devices to target the telecommunications and data communications markets. However, these DPLL devices have limited programmability and are generally designed to solve specific problems and work with specific line rates and protocols (e.g. 10G SONET/SDH, OC-3/OC-12/OC-48, OTN (OTU1/2/3), GbE, 10GbE, 10GFC, DS-3 mapping, etc).

Many of the traditional approaches to solving the problem of desynchronizing, or transparent clock recovery, for a client clock with stringent jitter and wander specifications usually attempt to use a "brute force" approach or an application-specific approach. Generally, such an approach is accomplished by designing an extremely narrow, low-pass filter with an order of three or greater. Such an approach is very difficult, if not impossible, to build in hardware and is not easily programmable and adaptable under program control. Furthermore, these approaches are cumbersome, difficult to understand, very time consuming to simulate, and have questionable performance characteristics. Many of the commercially available solutions tend to solve a single problem or work with a single line rate.

Thus, what are needed are systems and methods for a timing recovery architecture that is flexible, programmable, and easily and readily adaptable to solve a broad spectrum of line rates, mapping structures, and network topologies, while at the same time solving the most stringent and demanding timing recovery requirements and removing network-induced clock jitter and wander.

BRIEF SUMMARY OF THE INVENTION

In various exemplary embodiments, the present invention provides a flexible, programmable timing recovery architecture for critically-timed transport applications, recovering the clock timing from a received signal and removing or filtering unwanted jitter and wander. In a typical network application, various network nodes have the potential to modify payload signal timing through pointer processing, asynchronous mapping-demapping and byte or bit-stuffing techniques. Such "timing events" create disturbances on the client payload signal of interest, which manifest as jitter and wander and which must be filtered or removed upon egress from the transport network. The present invention provides a timing recovery architecture which not only recovers clock timing for critically-timed transport applications, but also filters and/or removes jitter and wander.

In one exemplary embodiment of the present invention, a system for providing timing recovery of a digital clock for a digital transmission includes providing a phase smoothing circuit, wherein the phase smoothing circuit redistributes potentially large timing discontinuities caused by the removal of overhead bytes, pointer justification bytes, stuff bytes, or other phase discontinuities in a signal, into a series of smaller and more frequent phase discontinuities in order to remove low frequency components in the power spectrum of the signal output, and providing a clock gapping circuit, wherein the clock gapping circuit outputs a timing pulse train with an average frequency equal to a desired output clock frequency. The timing pulse train is achieved by inhibiting timing pulses on a system clock based on a ratio that is proportional to an average output frequency relative to the system clock. This nominal ratio is set by numerator and denominator registers. The ratio is represented by physical registers and the physical registers are adjusted based on feedback from a control circuit. The ratio is adjusted by adding a control value to the numerator of the ratio, and the control value is normalized to represent the approximate control range in parts per million (ppm) desired for a timing recovery application. Optionally, the ratio is adjusted by adding a control value to the denominator of the ratio. A plurality of controlled clock gapping circuits are cascaded in a series, such that a highest gain controlled clock gapping circuit is first in the series, followed by one or more lower gain controlled clock gapping stages. Optionally, a plurality of controlled clock gapping circuits are cascaded such that the system is a three-stage implementation, wherein stage 1 is a high gain, fast response filtering stage, which performs the phase smoothing function, stage 2 is a low gain filtering stage, performing the timing recovery, function with jitter and wander attenuation, and stage 3 is a medium gain filtering stage, including a final phase-locked loop (PLL) filter and controlled oscillator, placed at the end of the series of cascaded controlled clock gapping circuits. This system for providing timing recovery of a digital clock for a digital transmission is implemented in programmable, digital FPGA (field programmable gate array) logic. Optionally, the system for providing timing recovery of a digital clock for a digital transmission is implemented in standard cell, gate-array ASIC (application-specific integrated circuit) technology. The phase smoothing circuit and the controlled clock gapping circuit remove clock jitter and wander in a video distribution and communications system.

In another exemplary embodiment of the present invention, the method for providing timing recovery of a digital clock for a digital transmission includes providing a phase smoothing circuit, wherein the phase smoothing circuit redistributes potentially large timing discontinuities caused by the removal of overhead bytes, pointer justification bytes, stuff bytes, or other phase discontinuities in a signal, into a series of smaller and more frequent phase discontinuities in order to remove low frequency components in the power spectrum of the signal output, and providing a clock gapping circuit, wherein the clock gapping circuit outputs a timing pulse train with an average frequency equal to a desired output clock frequency. The timing pulse train is achieved by inhibiting timing pulses on a system clock based on a ratio that is proportional to an average output frequency relative to the system clock. This nominal ratio is set by numerator and denominator registers. The ratio is represented by physical registers and the physical registers are adjusted based on feedback from a control circuit. The ratio is adjusted by adding a control value to the numerator of the ratio, and the control value is normalized to represent the approximate control range in parts per million (ppm) desired for a timing recovery application. Optionally, the ratio is adjusted by adding a control value to the denominator of the ratio. A plurality of controlled clock gapping circuits are cascaded in a series, such that a highest gain controlled clock gapping circuit is first in the series, followed by one or more lower gain controlled clock gapping stages. Optionally, a plurality of controlled clock gapping circuits are cascaded such that the system is a three-stage implementation, wherein stage 1 is a high gain, fast response filtering stage, which performs the phase smoothing function, stage 2 is a low gain filtering stage, performing the timing recovery, function with jitter and wander attenuation, and stage 3 is a medium gain filtering stage, including a final phase-locked loop (PLL) filter and controlled oscillator, placed at the end of the series of cascaded controlled clock gapping circuits. This system for providing timing recovery of a digital clock for a digital transmission is implemented in programmable, digital FPGA (field programmable gate array) logic. Optionally, the system for providing timing recovery of a digital clock for a digital transmission is implemented in standard cell, gate-array ASIC (application-specific integrated circuit) technology. The phase smoothing circuit and the controlled clock gapping circuit remove clock jitter and wander in a video distribution and communications system.

In still yet another exemplary embodiment of the present invention, a three-stage timing recovery, controlled clock gapping circuit apparatus includes a first stage high gain, fast response filtering controlled clock gapping circuit, wherein the clock gapping circuit outputs a timing pulse train, a first gapped clock, with an average frequency equal to a desired output clock frequency, wherein the first stage delivers the first gapped clock to a second stage, a second stage low gain filtering controlled clock gapping circuit, wherein the clock gapping circuit outputs a timing pulse train, a second gapped clock, with an average frequency equal to a desired output clock frequency, wherein the second stage implements a very slow response to changes in the first gapped clock, generates the filtered, second gapped clock, and delivers the second gapped clock to a third stage, a third stage medium gain filtering circuit, and wherein the third stage maintains a voltage controlled crystal oscillator locked to the second gapped clock received from the second stage. The first and second gapped clocks are achieved by inhibiting timing pulses, gapping, on the system clock based on a ratio that is proportional to an average output frequency relative to the system clock. The controlled clock gapping circuits are cascaded in a series.

Advantageously, the timing recovery architecture of the present invention operates to not only recover timing, but also to filter and/or remove unwanted jitter and wander.

There has thus been outlined, rather broadly, the features of the present invention in order that the detailed description that follows may be better understood, and in order that the present contribution to the art may be better appreciated. There are additional features of the invention that will be described and which will form the subject matter of the claims. In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed are for the purpose of description and should not be regarded as limiting.

As such, those skilled in the art will appreciate that the conception, upon which this disclosure is based, may readily be utilized as a basis for the designing of other structures, methods, and systems for carrying out the several purposes of the present invention. It is important, therefore, that the claims be regarded as including such equivalent constructions insofar as they do not depart from the spirit and scope of the present invention.

Additional aspects and advantages of the present invention will be apparent from the following detailed description of an exemplary embodiment which is illustrated in the accompanying drawings.

BRIEF DESCRIPTION OF THE DRAWINGS

The present invention is illustrated and described herein with reference to the various drawings, in which like reference numbers denote like system components and/or method steps, as appropriate, and in which.

DETAILED DESCRIPTION OF THE INVENTION

Before describing the disclosed embodiments of the present invention in detail, it is to be understood that the invention is not limited in its application to the details of the particular arrangement shown here since the invention is capable of other embodiments. Also, the terminology used herein is for the purpose of description and not of limitation.

For example, the systems and methods of the timing recovery circuit described herein are related to solving the difficult problem of transporting standard definition digital video through an optical network. Transport of digital video is an excellent example highlighting a video client's inherent timing specifications, which are significantly more stringent than even SONET/SDH (OC-N) requirements, which are already viewed by many skilled in this art as difficult to meet in their own right.

The timing recovery circuit described and shown is implemented in digital FPGA (field programmable gate array) logic; however, the same circuit may be implemented in standard cell or gate-array ASIC (application-specific integrated circuit) technology, or other like logic or integrated circuit systems.

Figure 1:
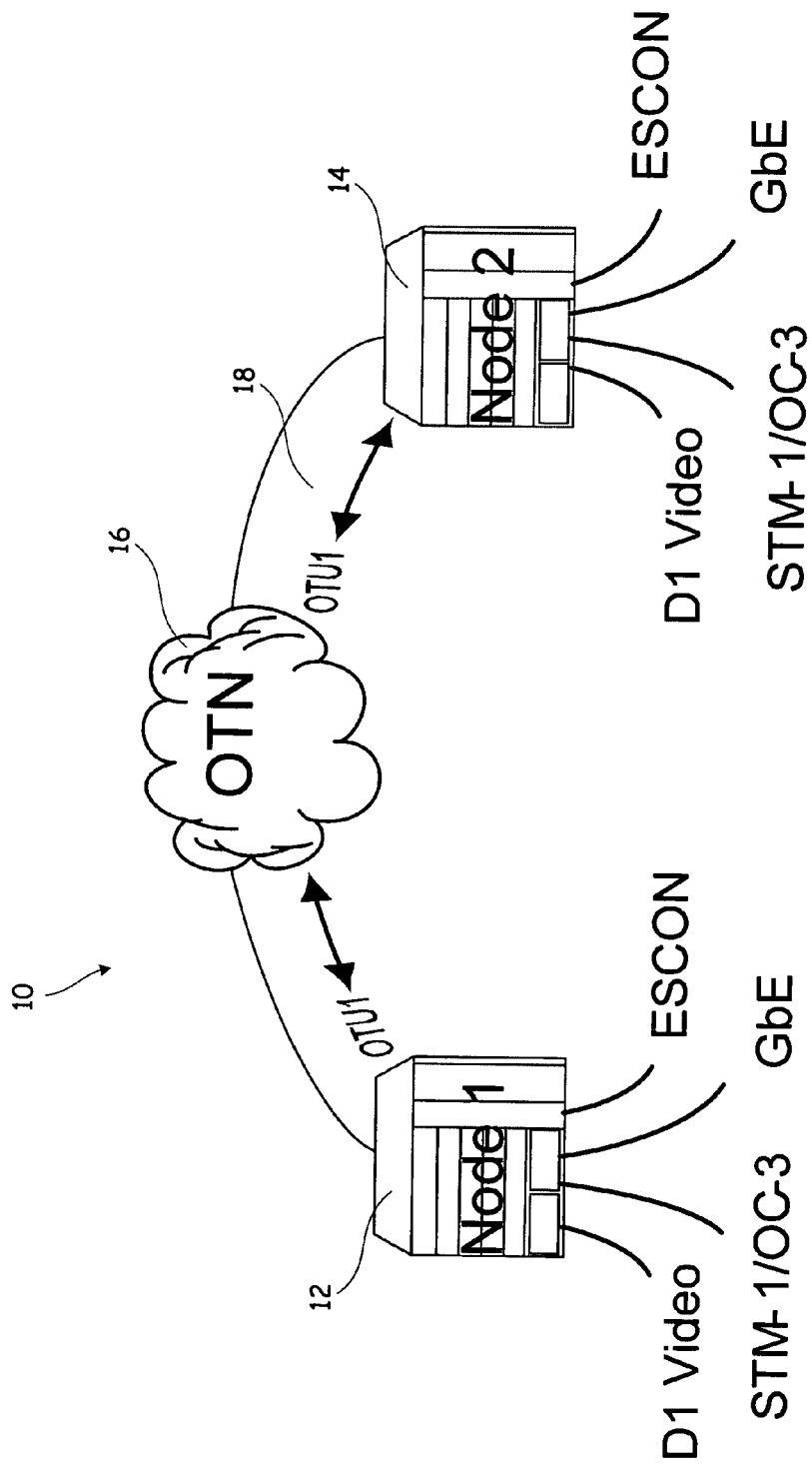
FIG. 1 is a schematic diagram illustrating a typical network application in which timing events such as pointer processing, asynchronous mapping-demapping, and byte or bit-stuffing techniques create disturbances in the timing of the example payload signals (D1 Video, ESCON, STM1/OC-3, and GbE), and in which the timing recovery architecture of the present invention is implemented for the purposes of timing recovery and the filtering and/or removal of jitter and wander according to an embodiment of the present invention.

Referring now to FIG. 1, a schematic diagram illustrating a typical network application 10, wherein a timing recovery architecture is needed, is shown. Illustrated is a typical network application 10 in which timing events such as pointer processing, asynchronous mapping-demapping, and byte or bit-stuffing techniques create disturbances in the timing of the example payload signals (D1 Video, ESCON, STM1/OC-3, and GbE), and in which the timing recovery architecture of the present invention is implemented for the purposes of timing recovery and the filtering and/or removal of jitter and wander.

The typical network application 10 diagram is shown with an OTN (optical transport network) network cloud 16, at least two network nodes 12, 14, and an optical transport 18 using OTU1. The OTN network cloud 16 can represent multiple timing islands (twenty six or more), and/or multiple mux-demux aggregation and add-drop points. The optical transport 18 is capable of transporting various optical signals such as D1 video, STM-1/OC-3, ESCON, GbE, etc.

As data for critically-timed applications, such as studio quality, high definition, or standard definition digital video, are transported between nodes 1 12 and 2 14, timing must be recovered. The critical timing specifications for video signaling are very stringent due to the nature and format of the video signal (such as the chrominance and luminance representation in component video formats), as well as the display requirements associated with interlaced active field scan and the blanking criteria inherent in video in general. Within this network environment, the typical network application 10, for example, the timing recovery architecture of the present invention operates to recover timing.

Additionally, as asynchronous mapping techniques, bit and/or byte-stuffing techniques, or traditional pointer adjustment schemes associated with traditional PDH (pleisiosynchronous digital hierarchy), SDH (synchronous digital hierarchy), and packet-based networks are implemented, timing disturbances, jitter and wander are created. The timing recovery architecture of the present invention operates to not only recover timing, but also filter or remove this unwanted jitter and wander.

Figure 2:
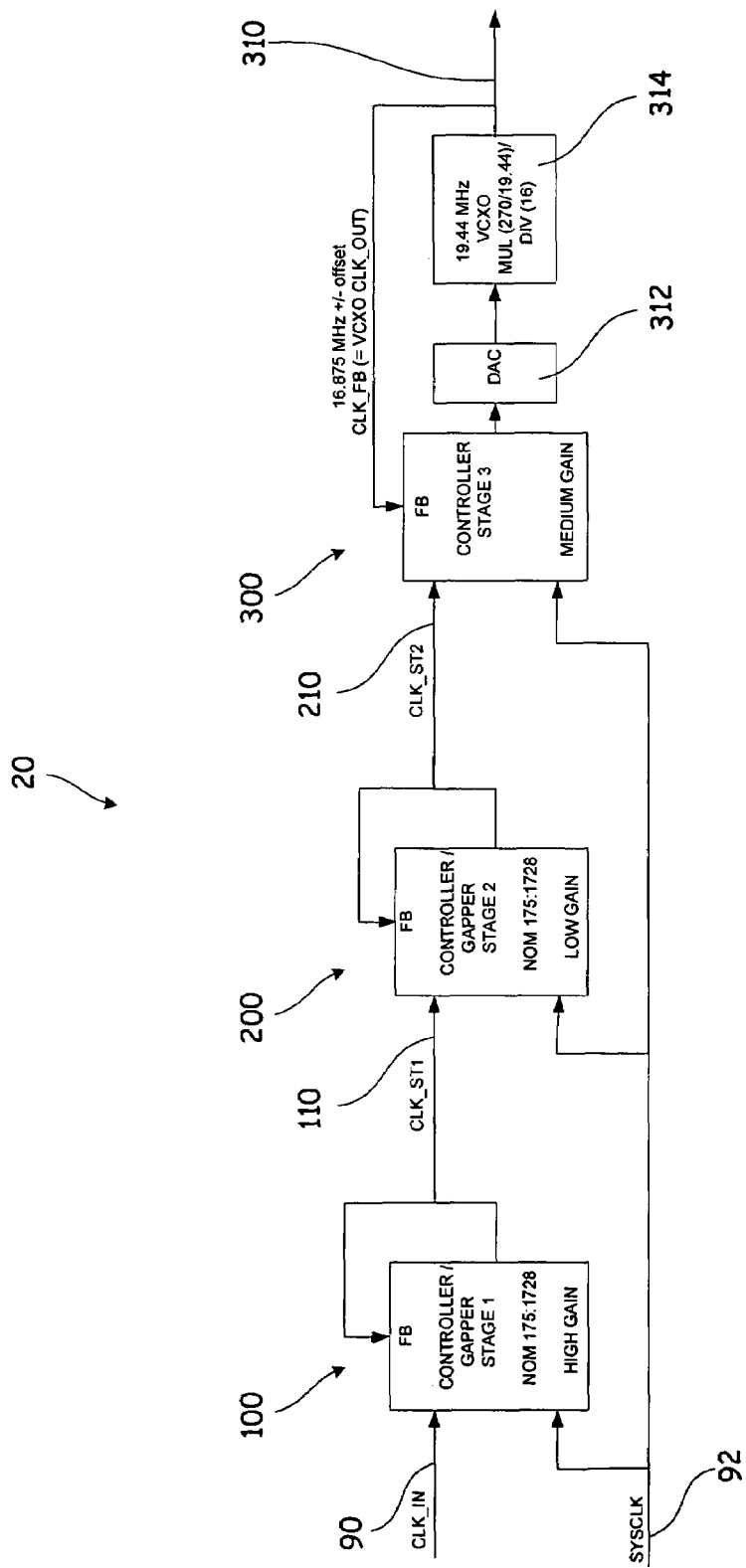
FIG. 2 is a schematic diagram illustrating the timing recovery controller architecture in a three-stage implementation for a digital video application, and further illustrating: Stage 1, the high gain, fast response filtering stage; Stage 2, the low gain filtering stage; and Stage 3, the medium gain filtering stage.

Referring now to FIG. 2, a schematic diagram illustrating the timing recovery controller architecture 20 in a three-stage implementation in a digital video application, further illustrating: Stage 1 100, the high gain, fast response filtering stage; Stage 2 200, the low gain filtering stage; and Stage 3 300, the medium gain filtering stage, is shown. The input clock, CLK_IN, 90 and the system clock, SYSCLK, 92 are shown.

The key element of the timing recovery controller architecture 20 design is the clock gapping circuit, referred to as the 'gapper'. The 'gapper' provides a gapped clock output whose average frequency may be in any ratio (less than 1) with the system clock (the clock that drives the 'gapper' logic). The ratio is represented by physical registers for numerator and denominator of the ratio, as well as an accumulator register, and the physical registers are adjusted based on feedback from a control circuit. The numerator is typically less than the denominator, to provide a fractional ratio of 'gapper' output clock to system clock. The fundamental operation of the gapping circuit is to repeatedly add the numerator to the accumulator with every system clock cycle. If the accumulator would exceed the value in the denominator register after any system clock cycle, then the denominator is also subtracted from the accumulator during that system clock cycle, leaving in the accumulator a value representing the fractional part of a gapped clock period which is carried forward in the accumulator to be counted in the calculation of the next gapped clock output pulse. The clock gapping circuit only outputs one gapped clock period (represented by an output pulse or clock signal) for every system clock period in which the accumulator value would exceed the denominator value, and inhibits gapped clock output otherwise. It is not necessary that the gapper perform the addition of the numerator to the accumulator each clock cycle. This is only one way of implementing the gapper. An alternative, higher performance implementation makes use of the fact that once nominal numerator and denominator values are determined, the gapped clock outputs will always occur spaced every n or n+1 system clock cycles, where n=[denominator/numerator], an integer value. The higher performance implementation calculates ahead of time the system clock period during which the next gapped clock output will begin by calculating whether numerator multiplied by n and added to accumulator would exceed denominator, and, if so, the accumulator is adjusted by adding [(numerator times n)−denominator], and the next gapped clock output is scheduled to occur n system clock cycles after the previous gapped clock output, otherwise it will be the case that numerator multiplied by (n+1) would exceed the accumulator is adjusted by adding [(numerator times (n+1)–denominator], and the next gapped clock output is scheduled to occur n+1 system clock cycles after the previous gapped clock output. The calculations for the times n and times (n+1) cases are performed in parallel for fastest operation, or serially to conserve logic resources. This higher performance implementation allows use of higher frequency system clocks and gapped clock outputs, because the calculation is spread out over several system clock cycles allowing more time for the arithmetic logic to complete the calculation than is the case in which the numerator is added to the accumulator every system clock cycle. In order to lock to an incoming clock, the nominal ratio is adjusted by adding a control value to either numerator or denominator (one of numerator or denominator, depending on the design choice; no need to control both in the same design). The control value is normalized to represent the approximate control range in ppm desired for the timing recovery application. In integer arithmetic, this is implemented by multiplying the numerator and the denominator by a normalization factor, and then appending the control factor to the multiplied numerator or denominator. Thus, the full range of the control factor represents a small fraction of the numerator or denominator, typically 10 to 300 ppm, depending on system requirements. A PD (Proportional-Differential) control method is used in this example, but this is not a requirement for the present invention. Other control methods (e.g., PID) may be used to give satisfactory system performance. Each control stage updates its control value once per control period. The length of the control period is chosen to allow sufficient time for the control algorithm to complete, as well as to provide sufficiently frequent control value updates to follow changes in rate of the input clock signal. Each control stage may have a different control period.

Stage 1 100 is the high gain, fast response filtering stage, which delivers the optimally-gapped clock to Stage 2 200 of the timing recovery controller architecture 20. The various protocols used to map and encapsulate payload signals for transport introduce timing disturbances by mapping the payload signals into frames or packets by adding overhead and fixed stuff bytes, and rate justification by pointer or stuffing information. Frequently, the frame or packet format calls for transmission of multiple consecutive overhead bytes or fixed stuff bytes. These consecutive bytes added or inserted into the payload signal information cause large timing disturbances in the payload signal. Optimal gapping spreads out effects of the pointer and mapper justifications and overhead and fixed stuff removal such that Stage 2 200 does not usually see more than a +1, 0, or −1 offset change since the previous control period. CLK_ST1 110 tracks CLK_IN 90, an input clock signal, closely, usually never allowing the Stage 1 100 offset count to exceed a −1, 0, +1 range.

Stage 2 200 is the low gain filtering stage, which implements a very slow response to changes in the CLK_ST1 110 clock and generates the filtered, gapped clock, CLK_ST2 210, of the timing recovery controller architecture 20. Due to the slow response of Stage 2 200, offset may accumulate to ±hundreds. CLK_ST2 210 may have slow damped oscillation (measured in a period of minutes) as it tracks closer and closer to the long-term average of CLK_ST1 110 reducing the peak offset value with each oscillation period.

Stage 3 300 is the medium gain filtering stage, which maintains the VCXO (voltage controlled crystal oscillator) 314 lock to the clock (CLK_ST2 210) from Stage 2 200, of the timing recovery controller architecture 20. Stage 3 is also shown with a DAC 312. Stage 3 300 is necessary because the VCXO 314 has insufficient frequency stability to meet the MTIE mask under low gain control (slow slew rate of the Stage 2 200 controller) and/or thermal transient conditions. In fact, the VCXO 314 would drift away from the CLK_ST2 210 output frequency generated by Stage 2 200 without the Stage 3 300 controller actively maintaining the VCXO 314 lock to CLK_ST2 210.

Stages 1, 2, and 3 100, 200, 300 all operate in a timing recovery mode and an acquisition mode. The timing recovery mode is the normal mode wherein the VCXO 314 is controlled to generate an MTIE-compliant output clock (CLK_OUT) 310 for the client signal. Acquisition mode is used when a new signal is sensed and all Stages 100, 200, 300 have gains set to high to rapidly track the average incoming CLK_IN 90 rate. After slewing to the new rate, gains are successively reduced to begin filtering required MTIE-compliant timing recovery. Stage 2 200 gain is reduced more than gains for Stage 1 100 and Stage 3 300.

The nominal gap ratio for the stages 1, 2, and 3 100, 200, 300 is 175/1728. This nominal gap ratio is the D1 video di-byte rate divided by the SYSCLK 92 rate, or, presented mathematically $(270/16)/(155.52*15/14)$, wherein $(270/16)$ equals the D1 video di-byte rate and $(155.52*15/14)$ equals the SYSCLK 92 rate.

Figure 3:
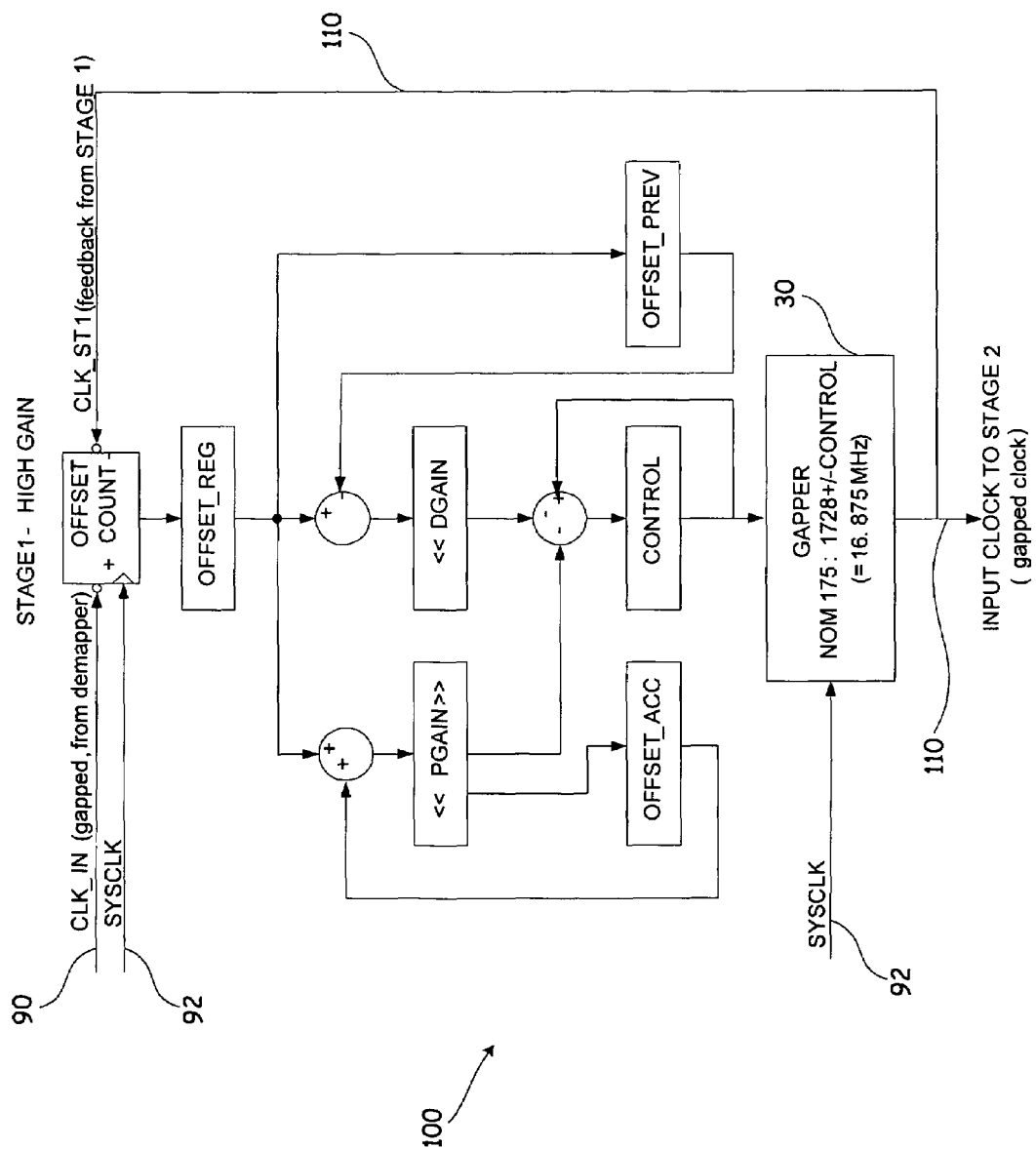
FIG. 3 is a schematic diagram illustrating Stage 1, the high gain, fast response filtering stage, which delivers the optimally-gapped clock to Stage 2 of the timing recovery controller architecture.

Referring now to FIG. 3, a schematic diagram illustrating Stage 1, the high gain, fast response filtering stage, of the timing recovery controller architecture 20 is shown. It utilizes proportional/differential (PGAIN/DGAIN) control with feedback to incrementally resolve problematic phase discontinuities. Stage 1 100 delivers the optimally-gapped clock output CLK_ST1 110 to Stage 2 200 of the timing recovery controller architecture 20. The clock gapping circuit 30 is shown. The input clock, CLK_IN, 90 and the system clock, SYSCLK, 92 are shown. The input clock, CLK_IN, 90 is gapped and is received from the demapper. Optimal gapping spreads out effects of the pointer and mapper justifications and overhead and fixed stuff removal such that Stage 2 200 does not usually see more than a +1, 0, or −1 offset change since the previous control period. CLK_ST1 110 tracks CLK_IN 90, an input clock signal, closely, usually never allowing the Stage 1 100 offset count to exceed a −1, 0, +1 range.

Figure 4:
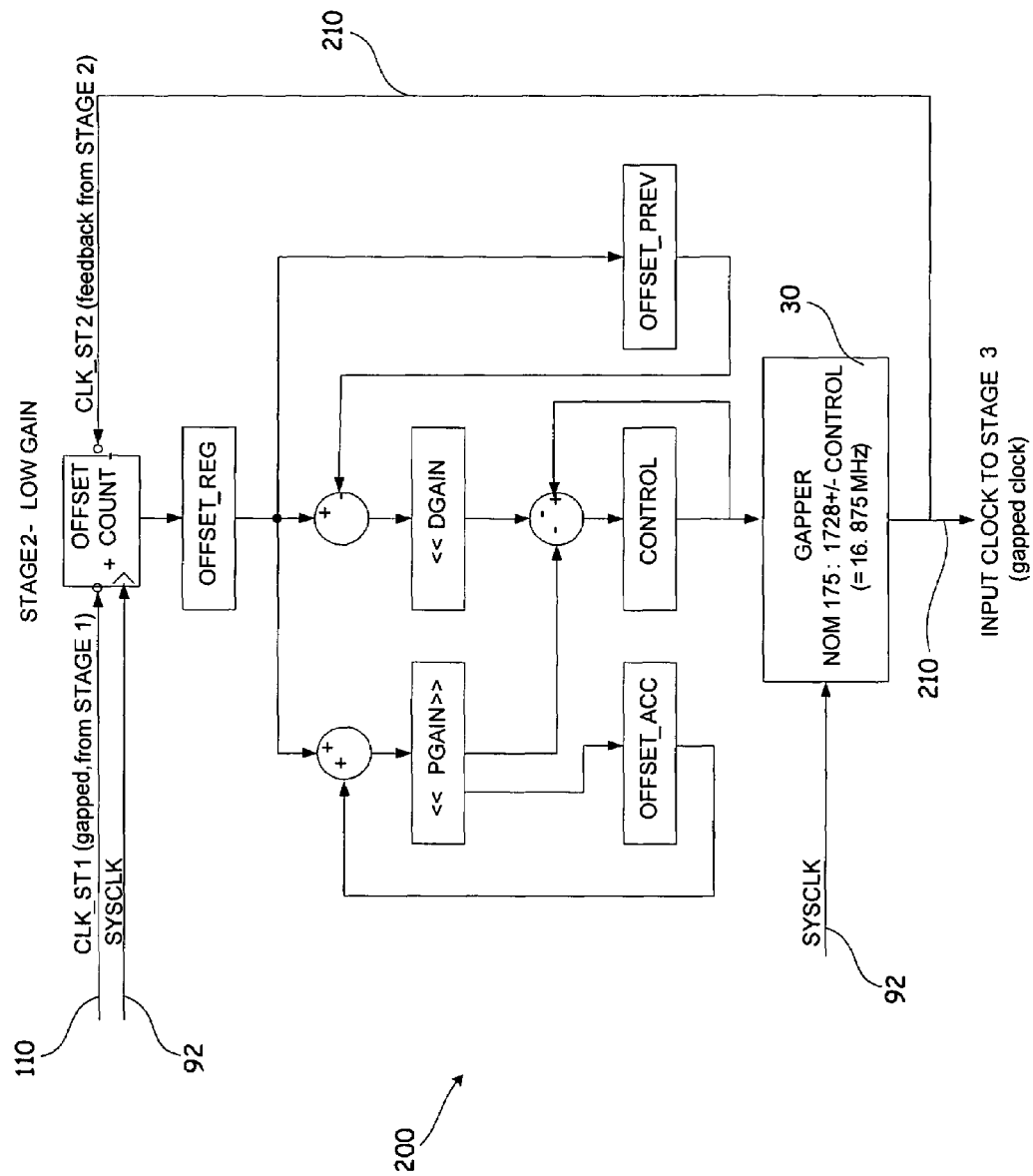
FIG. 4 is a schematic diagram illustrating Stage 2, the low gain filtering stage, which implements a very slow response to changes in the clock from Stage 1 and generates a filtered, gapped clock, of the timing recovery controller architecture.

Referring now to FIG. 4, a schematic diagram illustrating Stage 2, the low gain filtering stage, of the timing recovery controller architecture 20 is shown. It also utilizes proportional/differential (PGAIN/DGAIN) control with feedback to incrementally resolve problematic phase discontinuities. Stage 2 200 implements a very slow response to changes in the CLK_ST1 110 clock and generates the filtered, gapped clock, CLK_ST2 210, of the timing recovery controller architecture 20. Due to the slow response of Stage 2 200, offset may accumulate to hundreds of di-bytes. CLK_ST2 210 will have slow damped oscillation (measured in a period of minutes) as it tracks closer and closer to the long-term average of CLK_ST1 110.

Figure 5:
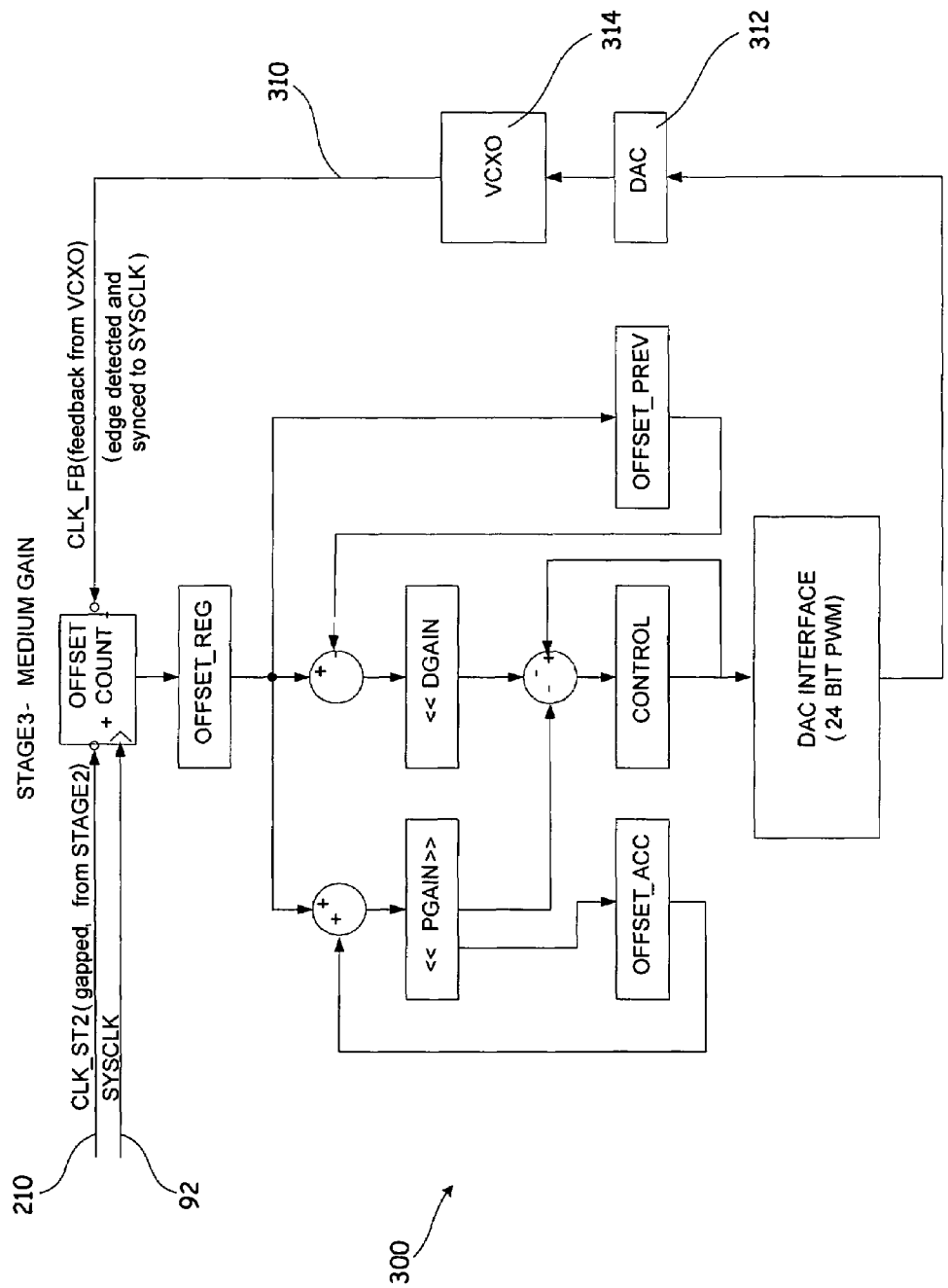
FIG. 5 is a schematic diagram illustrating Stage 3, the medium gain filtering stage, which maintains the VCXO (voltage controlled crystal oscillator) lock to the clock from Stage 2, of the timing recovery controller architecture.

Referring now to FIG. 5, a schematic diagram illustrating Stage 3, the medium gain filtering stage, of the timing recovery controller architecture 20 is shown. It also utilizes proportional/differential (PGAIN/DGAIN) control with feedback to incrementally resolve problematic phase discontinuities. Stage 3 300 maintains the VCXO (voltage controlled crystal oscillator) 314 lock to the clock (CLK_ST2 210) from Stage 2 200, of the timing recovery controller architecture 20. Stage 3 300 is necessary because the VCXO 314 has insufficient frequency stability to meet the MTIE mask under low gain control (slow slew rate of the Stage 2 200 controller) and/or thermal transient conditions. In fact, the VCXO 314 would drift away from the CLK_ST2 210 output frequency generated by Stage 2 200 without the Stage 3 300 controller actively maintaining the VCXO 314 lock to CLK_ST2 210.

Figure 6:
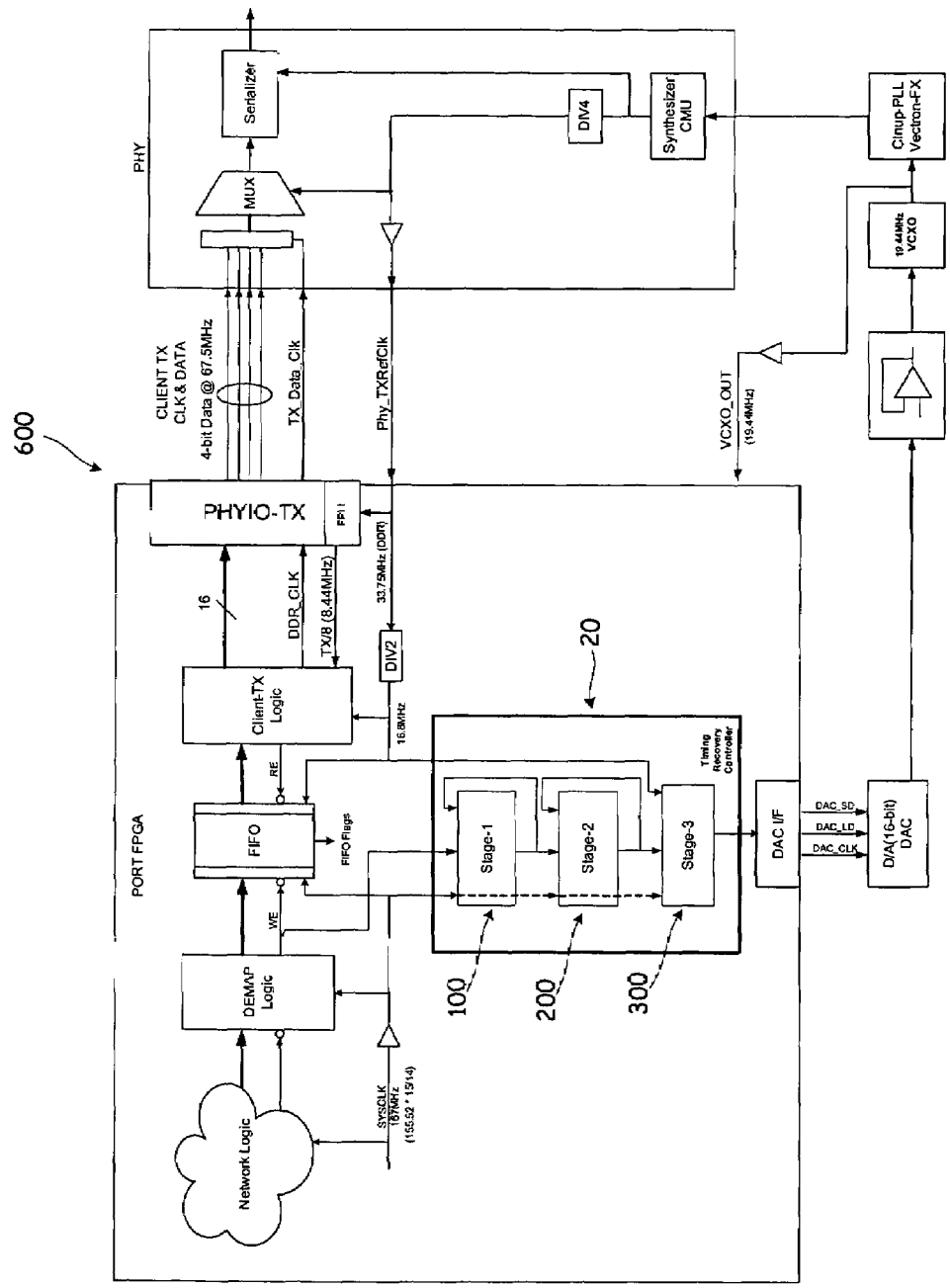
FIG. 6 is a schematic diagram illustrating the timing recovery controller architecture in a three-stage implementation in a digital video application, further illustrated as used in a typical FPGA-based egress architecture.

Referring now to FIG. 6, a schematic diagram illustrating the timing recovery controller architecture 20 in a three-stage implementation in a digital video application, further illustrated as used in a typical FPGA-based egress architecture 600, is shown. Stage 1 100, the high gain, fast response filtering stage; Stage 2 200, the low gain filtering stage; and Stage 3 300, the medium gain filtering stage, is shown.

Figure 7:
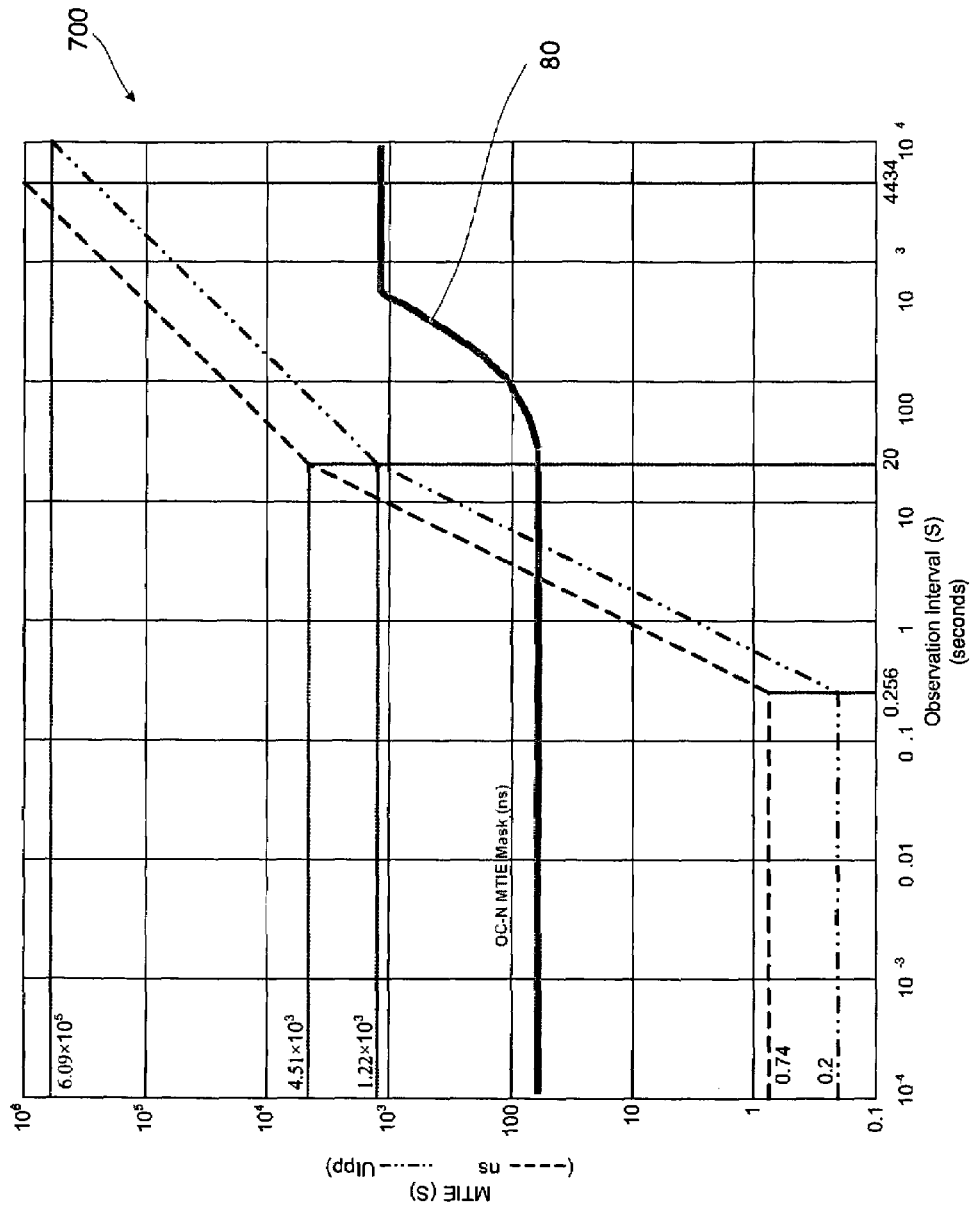
FIG. 7 is a graph diagram illustrating the MTIE (maximum time interval error) Mask for a D1 video output signal.

Referring now to FIG. 7, a graph diagram illustrating the MTIE (maximum time interval error) Mask for a D1 video output signal 700, is shown. The x-axis represents the observation interval in seconds and the y-axis represents the MTIE(S). The MTIE (Maximum Time Interval Error) mask 80 is derived from the following requirements as defined in these referenced documents: 1) ITU-R BT.470-6: Conventional Television Systems, 1998, 2) ITU-R BT.656-4: Interfaces for digital component video signals in 525-line and 625-line television systems operating at the 4:2:2 level of Recommendation ITU-R BT.601 (Part A), 1998, 3) ANSI/SMPTE 259M-1997: 10-Bit 4:2:2 Component and 4 fsc Composite Digital Signals—Serial Digital Interface, and 4) ANSI/SMPTE 297M-2000: Serial Digital Fiber Transmission System for ANSI/SMPTE 259M Signals.

The MTIE (Maximum Time Interval Error) mask 80 is:

$$MTIE(S) = \begin{cases} 0.2 \; UI & S \leq 0.2562874s \\ (3.04491675 \; UI/s^2)S^2 & 0.2562874s < S \leq 20s \\ (60.898335 \; UI/s)S & S > 20s \end{cases}$$

The output clock rate shall be 270 Mbps±2.8 ppm for a 525-line format video signal. The clock rate shall be 270 Mbps±0.226 ppm for a 625-line format video signal. The output clock drift shall be less than 0.1 Hz/s for either format. The output jitter from 10 Hz to 27 MHz shall be less than 0.2 UIpp. Note that this MTIE Mask is constructed by piece-wise construction of the jitter spec (0.2 UIpp), the frequency drift rate spec. and the frequency offset specification.

Figure 8:
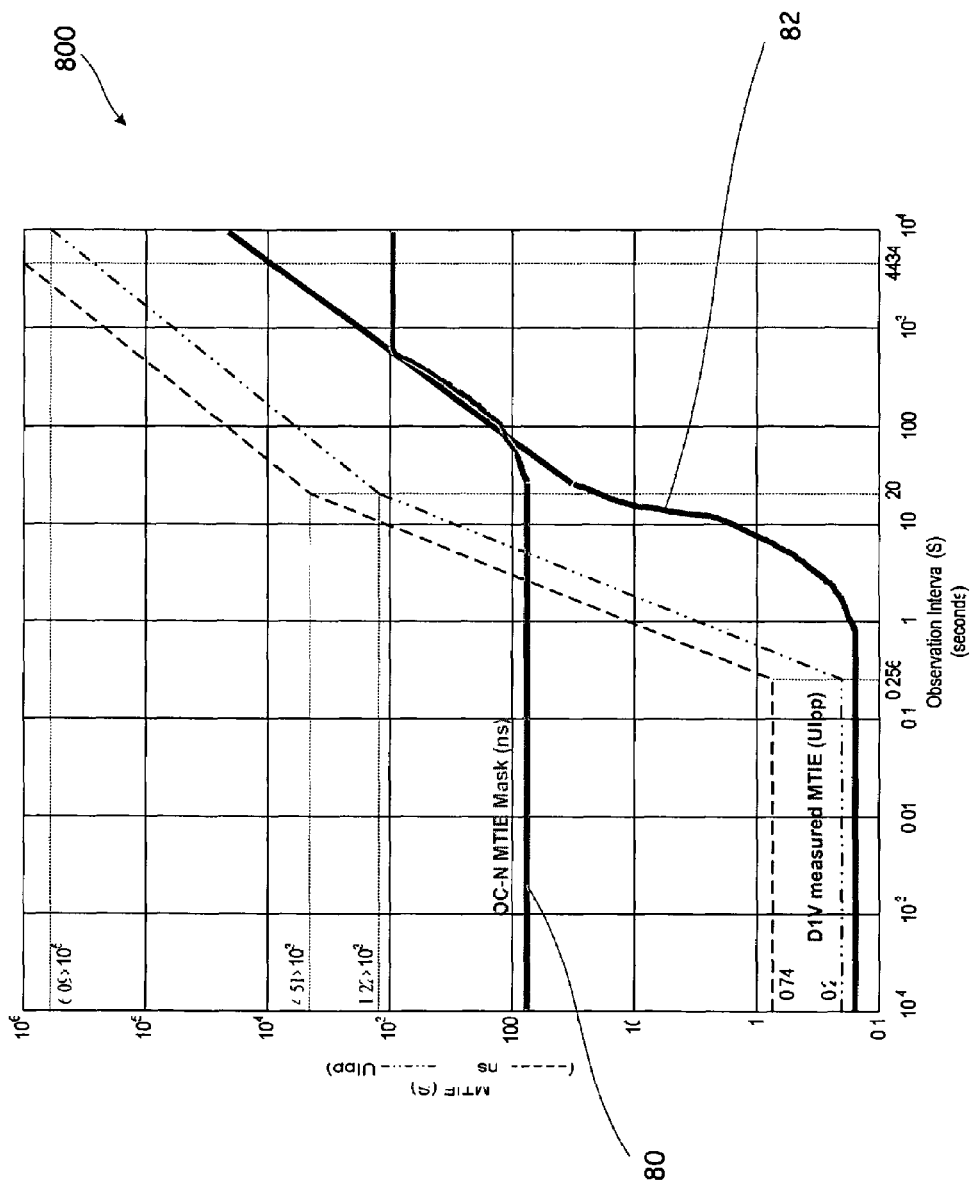
FIG. 8 is a graph diagram illustrating test results in an MTIE (maximum time interval error) plot.

Referring now to FIG. 8, a graph diagram illustrating the results in an MTIE (maximum time interval error) plot 800, is shown. The MTIE (Maximum Time Interval Error) mask 80 is shown as well as the D1V measured MTIE 82. The x-axis represents the observation interval in seconds and the y-axis represents the MTIE(S). The results are as follows: Measured Jitter: 10 Hz-27 MHz: <0.156 UIpp, over 3-days; 1 KHz-27 MHz: <0.069 UIpp, over 3-days; Measured Wander: <=−12.2 ppb/sec or <0.044 Hz/sec, over 3-days; Measured Freq. Offset: Less than 0.1 ppm peak variation (or 27 Hz) variation from input offset over 3 days observation interval.

Figure 9:
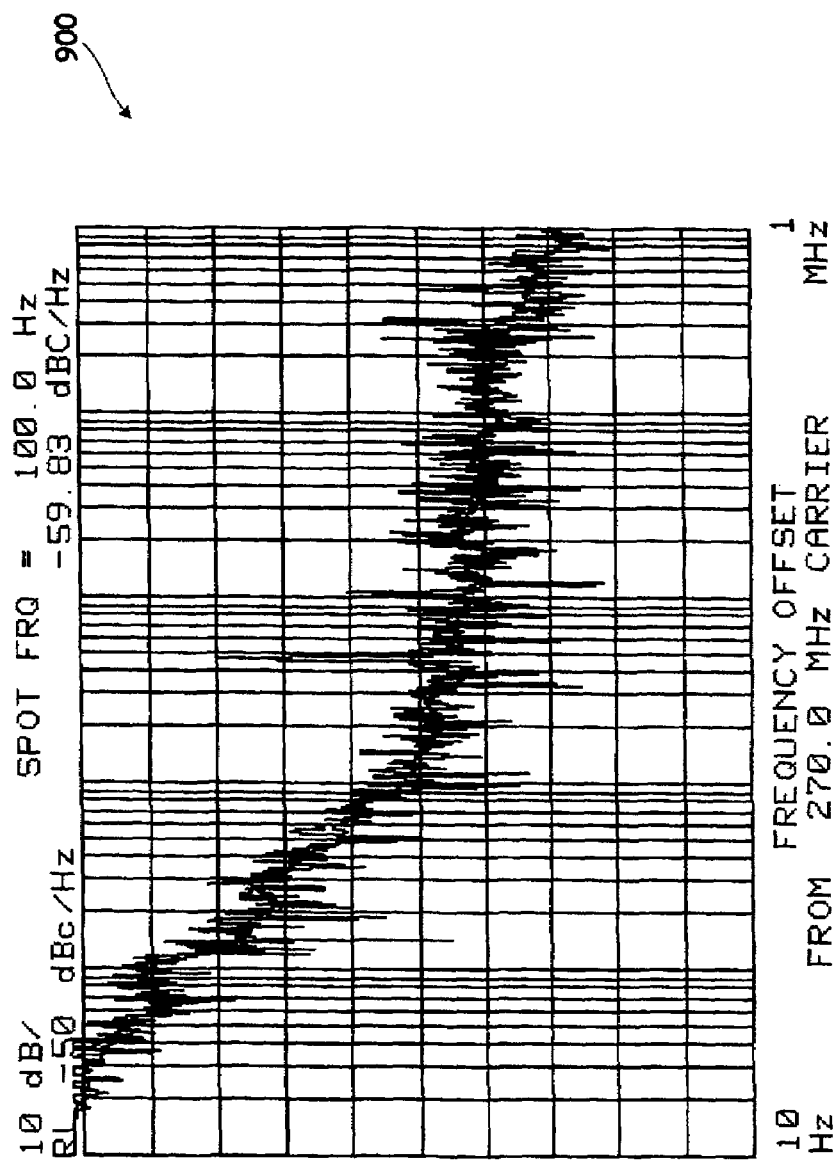
FIG. 9 is a graph diagram illustrating the resultant phase noise plot. The phase noise shown in the frequency domain is equivalent to jitter in the time domain.

Referring now to FIG. 9, a graph diagram illustrating the resultant phase noise plot 900, is shown. The x-axis represents the offset frequency (Hz) and the y-axis represents phase noise (dBc/Hz). The phase noise is plotted across the frequency band from 10 Hz to 1 MHz. Phase noise in the frequency domain is equivalent to jitter in the time domain.

Although the present invention has been illustrated and described herein with reference to preferred embodiments and specific examples thereof, it will be readily apparent to those of ordinary skill in the art that other embodiments and examples can perform similar functions and/or achieve like results. All such equivalent embodiments and examples are within the spirit and scope of the invention and are intended to be covered by the following claims.

What is claimed is:

1. A system for providing timing recovery of a digital clock for a digital transmission comprising:
    a phase smoothing circuit, wherein the phase smoothing circuit redistributes timing discontinuities caused by the removal of overhead bytes, pointer justification bytes, stuff bytes, or other phase discontinuities in a signal, into a series of smaller and more frequent phase discontinuities in order to remove low frequency components in the power spectrum of the signal, and
    a clock gapping circuit, wherein the clock gapping circuit outputs a timing pulse train with an average frequency equal to a desired output clock frequency, and wherein the clock gapping circuit utilizes analog proportional/differential control with feedback, and
    wherein the timing pulse train is achieved by inhibiting timing pulses on a system clock based on a ratio that is proportional to an average output frequency relative to the system clock, and
    wherein a plurality of controlled clock gapping circuits are cascaded in a series such that a highest gain controlled clock gapping circuit is first in the series followed by a one or more lower gain controlled clock gapping stages, and
    wherein a plurality of controlled clock gapping circuits are cascaded in series such that the system is a three-stage implementation, wherein stage 1 is a fast response filtering stage which performs the phase-smoothing function, stage 2 is a low gain filtering stage which performs the timing recovery function, and stage 3 is a medium gain filtering stage further comprising a final phase-locked loop (PLL) filter and a controlled oscillator, placed at the end of the series of cascaded controlled clock gapping circuits.

2. The system for providing timing recovery of a digital clock for a digital transmission of claim 1, wherein the ratio is represented by physical registers and wherein the physical registers are adjusted based on feedback from a control circuit.

3. The system for providing timing recovery of a digital clock for a digital transmission of claim 1, wherein the ratio is adjusted by adding a control value to the numerator of the ratio, wherein the control value is normalized to represent the approximate control range in a parts per million (ppm) desired for a timing recovery application.

4. The system for providing timing recovery of a digital clock for a digital transmission of claim 1, wherein the ratio is adjusted by adding a control value to the denominator of the ratio, and wherein the control value is normalized to represent the approximate control range in parts per million (ppm) desired for a timing recovery application.

5. The system for providing timing recovery of a digital clock for a digital transmission of claim 1, wherein the system for providing timing recovery of a digital clock for a digital transmission is implemented in programmable, digital FPGA (field programmable gate array) logic.

6. The system for providing timing recovery of a digital clock for a digital transmission of claim 1, wherein the system for providing timing recovery of a digital clock for a digital transmission is implemented in standard cell, gate-array ASIC (application-specific integrated circuit) technology.

7. The system for providing timing recovery of a digital clock for a digital transmission of claim 1, wherein the phase smoothing circuit and the controlled clock gapping circuit remove clock discontinuities in a video distribution and communications system.

8. A method for providing timing recovery of a digital clock for a digital transmission comprising:
providing a phase smoothing circuit, wherein the phase smoothing circuit redistributes timing discontinuities caused by the removal of overhead bytes, pointer justification bytes, stuff bytes, or other phase discontinuities in a signal, into a series of smaller and more frequent phase discontinuities in order to remove low frequency components in the power spectrum of the signal, and
providing a clock gapping circuit, wherein the clock gapping circuit outputs a timing pulse train with an average frequency equal to a desired output clock frequency, and wherein the clock gapping circuit utilizes analog proportional/differential control with feedback, and
wherein the timing pulse train is achieved by inhibiting timing pulses on a system clock based on a ratio that is proportional to an average output frequency relative to the system clock, and
wherein a plurality of controlled clock gapping circuits are cascaded in a series, such that a highest gain control circuit is first in the series, followed by a one or more lower gain stages, and
wherein a plurality of controlled clock gapping circuits are cascaded such that the system is a three-stage implementation, wherein stage 1 is a fast response filtering stage which performs the phase smoothing function, stage 2 is a low gain filtering stage which performs the timing recovery function, and stage 3 is a medium gain filtering stage further comprised of a final phase-locked loop (PLL) filter and a controlled oscillator placed at the end of the series of cascaded controlled clock gapping circuits.

9. The method for providing timing recovery of a digital clock for a digital transmission of claim 8, wherein the ratio is represented by physical registers and wherein the physical registers are adjusted based on feedback from a control circuit.

10. The method for providing timing recovery of a digital clock for a digital transmission of claim 8, wherein the ratio is adjusted by adding a control value to the numerator of the ratio, wherein the control value is normalized to represent the approximate control range in a parts per million (ppm) desired for a timing recovery application.

11. The method for providing timing recovery of a digital clock for a digital transmission of claim 8, wherein the ratio is adjusted by adding a control value to the denominator of the ratio, and wherein the control value is normalized to represent the approximate control range in a parts per million (ppm) ppm desired for a timing recovery application.

12. The method for providing timing recovery of a digital clock for a digital transmission of claim 8, wherein the system for providing timing recovery of a digital clock for a digital transmission is implemented in programmable, digital FPGA (field programmable gate array) logic.

13. The method for providing timing recovery of a digital clock for a digital transmission of claim 8, wherein the system for providing timing recovery of a digital clock for a digital transmission is implemented in standard cell, gate-array ASIC (application-specific integrated circuit) technology.

14. The method for providing timing recovery of a digital clock for a digital transmission of claim 8, wherein the phase smoothing circuit and the controlled clock gapping circuit remove clock discontinuities in a video distribution and communications system.

15. A three-stage timing recovery, controlled clock gapping circuit apparatus, comprising:
a first stage fast response filtering controlled clock gapping circuit, wherein the clock gapping circuit outputs a timing pulse train, a first gapped clock, with an average frequency equal to a desired output clock frequency,
wherein the first stage delivers the first gapped clock to a second stage,
a second stage filtering controlled clock gapping circuit, wherein the clock gapping circuit outputs a timing pulse train, a second gapped clock, with an average frequency equal to a desired output clock frequency,
wherein the second stage implements a slow response to changes in the first gapped clock, generates the filtered, second gapped clock, and delivers the second gapped clock to a third stage,
a third stage filtering circuit,
wherein the third stage maintains a voltage controlled crystal oscillator locked to the second gapped clock received from the second stage,
wherein the first and second gapped clocks are achieved by inhibiting timing pulses, gapping, on the system clock based on a ratio that is proportional to an average output frequency relative to the system clock, and
wherein the controlled clock gapping circuits are cascaded in a series, and
wherein the controlled clock gapping circuits utilize analog proportional/differential control with feedback.

\* \* \* \* \*